United States Patent
Ramotowski

(12) 
(10) Patent No.: US 6,440,755 B1
(45) Date of Patent: Aug. 27, 2002

(54) METHOD FOR INCREASING FRACTURE TOUGHNESS AND REDUCING BRITTLENESS OF FERROELECTRIC POLYMER

(75) Inventor: Thomas S. Ramotowski, Tiverton, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/922,309

(22) Filed: Jul. 30, 2001

(51) Int. Cl.$^7$ ............................................... H01L 21/00
(52) U.S. Cl. ............................. 438/3; 438/3; 438/255; 438/758; 438/778
(58) Field of Search ................................ 257/295, 768, 257/769; 438/3, 255, 758, 778, 781

(56) References Cited

U.S. PATENT DOCUMENTS

| | | | |
|---|---|---|---|
| 3,872,318 A | * 3/1975 | Murayama | 307/88 |
| 4,348,611 A | * 9/1982 | Ruppel et al. | 313/388 |
| 6,133,159 A | * 10/2000 | Vaarstra et al. | 438/758 |
| 6,180,420 B1 | * 1/2001 | Hintermaier et al. | 438/3 |
| 6,323,511 B1 | * 11/2001 | Marsh | 257/295 |

* cited by examiner

*Primary Examiner*—David Nelms
*Assistant Examiner*—Dao H Nguyen
(74) *Attorney, Agent, or Firm*—Michael J. McGowan; Michael F. Oglo; Prithvi C. Lall

(57) ABSTRACT

A method is provided that increases fracture toughness and reduces brittleness of a semi-crystalline ferroelectric polymer material while substantially maintaining ferroelectric properties of the material. The material is heated in an inert oxygen-free atmosphere to a temperature above the material's Curie transition but below its melting temperature. The material is then irradiated with beta particles to provide a desired level of fracture toughness that substantially maintains ferroelectric properties of the material. In the case of poly(vinylidene fluoride-trifluorethylene), the heating temperature is just above the material's Curie transition temperature, the beta particles have an energy level of approximately 2.5 mega electron volts (MeV), and the radiation dose should not exceed approximately 50 megarads (Mrads).

20 Claims, 2 Drawing Sheets

FRACTURE TOUGHNESS v. RADIATION DOSE
65/35 p(VDF-TrFE) 100°C/1.2MeV

METHOD FOR INCREASING FRACTURE TOUGHNESS AND REDUCING BRITTLENESS OF FERROELECTRIC POLYMER

CROSS-REFERENCE TO RELATED PATENT APPLICATIONS

This patent application is co-pending with one related patent application Ser. No. 09/922,310 entitled "METHOD FOR INCREASING FRACTURE TOUGHNESS AND REDUCING BRITTLENESS OF SEMI-CRYSTALLINE POLYMER" by the same inventor as this patent application and filed on even date.

STATEMENT OF GOVERNMENT INTEREST

The invention described herein may be manufactured and used by or for the Government of the United States of America for Governmental purposes without the payment of any royalties thereon or therefor.

BACKGROUND OF THE INVENTION (1) Field of the Invention

The present invention relates generally to the manufacture of annealed ferroelectric copolymer materials, and more particularly to a method for increasing fracture toughness and reducing brittleness of a semi-crystalline ferroelectric polymer material such as poly(vinylidene fluoride-trifluorethylene) or p(VDF-TrFE).

(2) Description of the Prior Art

Many semi-crystalline polymers become brittle when formed into thin sheets. In terms of a quantitative measure, these materials have a low fracture toughness which is measured as energy per unit volume in Joules/meter$^3$ (J/m$^3$). Brittleness is caused by a high percentage of crystallinity and/or an increased average size of the polymer crystallites brought about by the manufacturing process. As a result of the material's brittleness, damage during normal handling thereof is prevalent thereby increasing the cost of using semi-crystalline polymers in various products.

In some applications, crystallinity percentages in excess of 80% are desired or required in order for the semi-crystalline material to perform properly. For example, the use of ferroelectric p(VDF-TrFE) has been problematic because it is necessary to anneal the material to a very high level of crystallinity in order to maximize the material's piezoelectric properties. However, while the annealing step greatly increases the material's crystallinity in preparation for a ferroelectric poling operation, this processing step also makes the treated material so brittle that it often cracks during routine handling thereof.

SUMMARY OF THE INVENTION

Accordingly, it is an object of the present invention is to provide a method for increasing a semi-crystalline ferro-electric material's fracture toughness to thereby reduce its brittleness without substantially damaging the material's ferroelectric properties.

Another object of the present invention is to provide a method to increase the fracture toughness of an annealed ferroelectric polymer material while substantially maintaining the material's ferroelectric properties.

A still further object of the present invention is to provide for increased use of ferroelectric p(VDF-TrFE) in applications where the material's brittleness previously prevented such use.

Still another object of the present invention is to reduce the brittleness of ferroelectric p(VDF-TrFE) while retaining its ferroelectric properties.

Other objects and advantages of the present invention will become more obvious hereinafter in the specification and drawings.

In accordance with the present invention, a method is provided that increases fracture toughness and reduces brittleness of a semi-crystalline ferroelectric polymer material while substantially maintaining ferroelectric properties of the material. A semi-crystalline ferroelectric polymer material such as poly(vinylidene fluoride-trifluorethylene) is placed in an inert oxygen-free atmosphere. The material is heated to a temperature that is greater than the material's Curie transition temperature, but below its melting temperature. The material is then irradiated with beta particles to provide a desired level of fracture toughness that substantially maintains ferroelectric properties of the material. In the case of poly(vinylidene fluoride-trifluorethylene), the heating temperature is approximately between 100–120° C., the beta particles have an energy level of approximately 2.5 mega electron volts (MeV), and the radiation dose does not exceed approximately 50 megarads (Mrads).

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DESCRIPTION OF THE PREFERRED EMBODIMENT(S)

Figure 1:
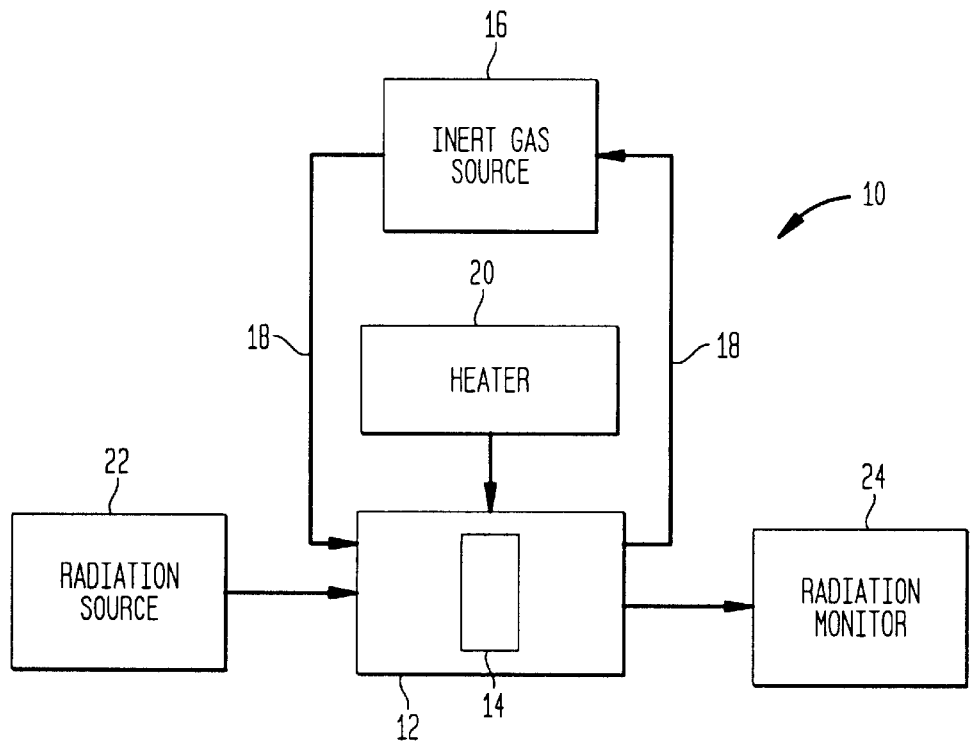
FIG. 1 is a schematic view of an apparatus for carrying out the method of increasing fracture toughness of a semi-crystalline polymer material in accordance with the present invention.

Referring now to the drawings, and more particularly to FIG. 1, a system for carrying the method of increasing fracture toughness in accordance with the present invention is shown and referenced generally by numeral 10. As is known in the art, fracture toughness is a quantitative measurement indicative of the energy required to crack/fracture a material. Thus, increasing fracture toughness of a material reduces its brittleness which, while not a measurable quantity, describes a quality thereof.

System 10 includes a fixture or chamber 12 (e.g., a sealed chamber, irradiation fixture, etc.) for holding a semi-crystalline polymer material 14 to be processed in accordance with the present invention. In order to assure that no chemical reactions occur between material 14 and its surrounding gaseous environment, an inert gas source 16 supplies chamber 12 with an inert gas environment, i.e., inert with respect to material 14. Typically, a flow of inert gas is passed continuously through chamber 12 as indicated by arrows 18. The gas is oxygen-free because many polymeric materials can react with oxygen during irradiation thereof. Although not an exhaustive list, some common inert gases suitable for use in the present invention include nitrogen and argon.

A heater 20 is coupled to chamber 12 for raising the temperature of material 14 during the processing thereof. A radiation source 22 generates a beam of beta radiation that is directed to/through chamber 12, i.e., material 14 is exposed to high energy electrons. A radiation dosage monitor 24 is coupled to/through chamber 12 for monitoring/measuring the radiation dosage to which material 14 is exposed. System 10 so constructed/configured can be made from a variety of commercially-available components as would be understood by one of ordinary skill in the art.

In operation of system 10 in accordance with the present invention, material 14 is placed in chamber 12 and a flow 18 of inert gas is provided to chamber 12 by inert gas source 16. Flow 18 should be sufficient to purge chamber 12 of oxygen-containing atmospheric gas so that only the inert gas is contained in chamber 12. Heater 20 is activated to heat material 14 to a temperature that, in general, is greater than the Curie transition temperature of material 14, but below the melting temperature of material 14. As is known in the art, the Curie transition temperature is a known quantity for a given material content. In the present invention, with material 14 being heated under an inert gas purge, radiation source 22 irradiates material 14 with beta particles of a specified energy. Radiation dosage is simultaneously monitored by a radiation monitor 24 which is representative of direct monitoring systems or indirect monitoring systems such as those capable of monitoring electron flux. In these conditions, it was found that an increase in fracture toughness was associated with the energy level of the radiation and the amount of radiation to which material 14 is exposed. Thus, depending on the type material 14 and the desired level of fracture toughness, irradiation of material 14 continues until a specified radiation dosage is achieved indicative of the desired level of fracture toughness for a given energy level of radiation.

The above-described process was used successfully for the semi-crystalline polymer poly(vinylidene-trifluorethylene) (or p(VDF-TrFE)) comprised of 50–85 weight percent vinylidene fluoride (VDF) which, in its cast form, has a crystallinity of 40–50%. However, crystallinity of this material can be increased to 80–90% or more using an annealing process. Whether cast or annealed, p(VDF-TrFE) is generally formed into thin sheets which are less brittle in the cast form, but highly brittle in the annealed form.

To increase the fracture toughness of semi-crystalline p(VDF-TrFE) without regard to retaining the material's ferroelectric properties, the p(VDF-TrFE) material was placed in an irradiation fixture under a nitrogen purge, and heated to a temperature between approximately 100–120° C., i.e., greater than room temperature but below the material's melting temperature. The p(VDF-TrFE) was then irradiated with approximately 1.2 mega electron volt (MeV) beta particles while the radiation was monitored. A graph of the resulting fracture toughness as a function of radiation dosage is illustrated in FIG. 2 for a p(VDF-TrFE) polymer comprised of 65 weight percent VDF that was heated to 100° C. under a nitrogen purge.

Figure 2:
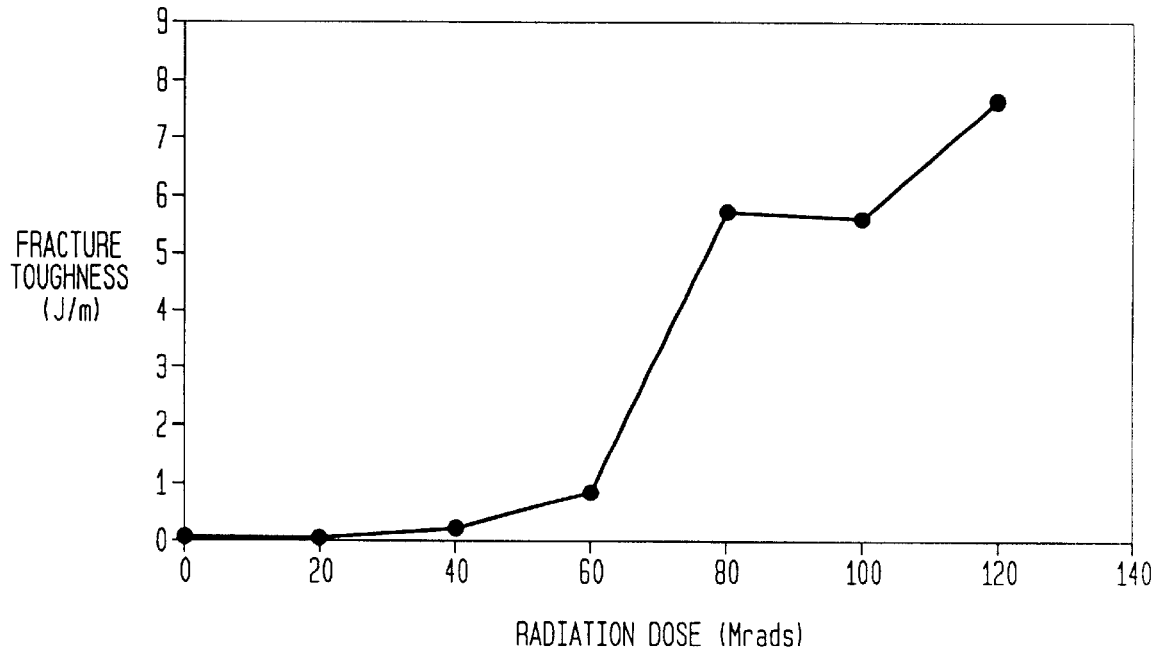
FIG. 2 is a graph of fracture toughness as a function of radiation dosage for the semi-crystalline polymer poly (vinylidene fluoride-trifluorethylene) after processing in accordance with the present invention.

As is evident from the graph in FIG. 2, significant improvements in fracture toughness were realized. The greatest increase in fracture toughness occurred when radiation dosage was increased from approximately 60 to approximately 80 megarads (Mrads) for a radiation dosage of 1.2 MeV. Note that this result is unexpected since, below the melting temperature, beta particle radiation on its own would be expected to induce polymer chain scissioning and perhaps some cross-linking, both of which tend to reduce fracture toughness. It is therefore believed that the present invention's combination of steps increases fracture toughness by means of a reduction in the average size of the crystallites in the material through the generation of pendant group defects which interfere with crystallinity.

It is apparent from the above description that the semi-crystalline polymer p(VDF-TrFE) can undergo dramatic increases in fracture toughness. However, p(VDF-TrFE) is also commonly used in its ferroelectric state for the manufacture of transducers and hydrophones. To achieve the ferroelectric state, cast semi-crystalline p(VDF-TrFE) can be poled to align its domains, or can first be annealed to increase crystallinity and then poled as is well known in the art. The problem that plagues cast or annealed ferroelectric p(VDF-TrFE) is its brittleness. However, any increase in fracture toughness/decrease in brittleness for this material usage must be achieved while maintaining the material's ferroelectric properties/domains. The patentee then inventively discovered that the above-described process of increasing fracture toughness caused a destruction of ferroelectric domains at levels of fracture toughness that were less than 1 J/m$^3$. That is, the dramatic increases in fracture toughness evidenced in FIG. 2 came at the expense of ferroelectric domain destruction in the case of ferroelectric p(VDF-TrFE). Therefore, continued irradiation is counter-productive for usages of the material in which ferroelectric properties are desired. Such usages include the construction of hydrophone sensing elements.

Figure 3:
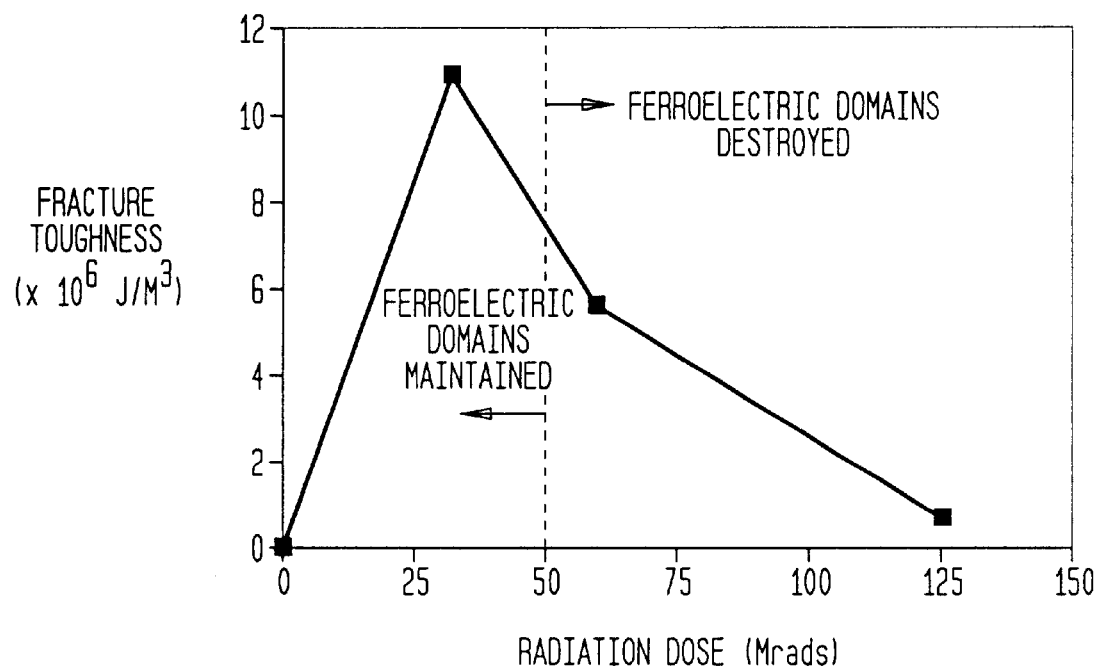
FIG. 3 is a graph of fracture toughness as a function of radiation dosage for the annealed ferroelectric polymer poly(vinylidene fluoride-trifluorethylene) after processing in accordance with the present invention.

To overcome this problem, it is necessary to heat the material to a temperature that is above its Curie transition temperature, and select a suitable beta particle radiation energy level and radiation dosage that achieves a desired level of fracture toughness without destroying the material's ferroelectric properties. In terms of cast or annealed ferroelectric p(VDF-TrFE) comprised of 50–85 weight percent VDF, it was found that an increased radiation energy level could increase the material's fracture toughness without destroying its ferroelectric properties. This is evidenced in FIG. 3 for an annealed ferroelectric p(VDF-TrFE) having 65 weight percent VDF that is heated to 120° C. under a nitrogen purge prior to irradiation with 2.55 (MeV) beta particles. In particular, it was found that at this radiation energy level, ferroelectric properties which were initially present were substantially maintained for radiation doses up to approximately 50 Mrads. After this, increases in beta particle energy levels destroyed ferroelectric properties. Note that substantial fracture toughness (which also is a maximum value of the limited number of data points in FIG. 3) was achieved and ferroelectric properties maintained at a radiation dosage of approximately 32.5 Mrads. As FIG. 3 shows, the fracture toughness initially monotonically increased to the substantial toughness value at a dosage of approximately 32.5 megarads, and thereafter decreases, and is in fact a monotonically decreasing value at the aforesaid 50 megarads value of dosage. Also, note that if only increased fracture toughness is of concern, this example implies that fracture toughness can be increased by utilizing beta particles having an energy level between approximately 1.0–3.0 MeV.

The advantages of the present invention are numerous. Cast or annealed ferroelectric p(VDF-TrFE) can have its fracture toughness increased without loss of ferroelectric properties. This will greatly reduce breakage of components made from this material thereby making the assemblies including same more reliable and cost-effective. While the mechanisms at work in the present invention are not fully understood, it is believed that the above-described methodology can be extended to other semi-crystalline ferroelectric polymers. In general, once a desired fracture toughness is identified, a particular combination of heating, electron energy bombardment and radiation dosage can be implemented in a repeatable manufacturing process. With the heat and electron energy being fixed for a given material, only radiation dosage need be monitored as fracture toughness is a function thereof in the present process.

It will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. A method for increasing fracture toughness and reducing brittleness of a semi-crystalline ferroelectric polymer material while substantially maintaining ferroelectric properties of said material, comprising the steps of:

placing a semi-crystalline ferroelectric polymer material in an oxygen-free atmosphere that is inert with respect to said material;

heating said material to a temperature that is above said material's Curie transition but below its melting temperature; and irradiating said material so-heated with beta particles to provide a desired level of fracture toughness within a range of radiation dosage that substantially maintains ferroelectric properties of said material, wherein said fracture toughness varies as a function of radiation dose received by said material.

2. A method according to claim 1 wherein said atmosphere is a gas selected from the group consisting of nitrogen and argon.

3. A method according to claim 1 wherein said material is poly(vinylidene fluoride-trifluorethylene), and wherein said temperature achieved during said step of heating is between approximately 100–120° C.

4. A method according to claim 1 wherein said material is poly(vinylidene fluoride-trifluorethylene) having approximately 50–85 weight percent vinylidene fluoride.

5. A method according to claim 1 wherein said material is poly(vinylidene fluoride-trifluorethylene) having approximately 65 weight percent vinylidene fluoride, and wherein said temperature achieved during said step of heating is approximately 120° C.

6. A method according to claim 1 wherein said beta particles have an energy level of approximately 2.5 mega electron volts (MeV).

7. A method for increasing fracture toughness and reducing brittleness of semi-crystalline ferroelectric poly (vinylidene fluoride-trifluorethylene) while substantially maintaining ferroelectric properties thereof, comprising the steps of:

providing an environment containing a gas selected from the group consisting of nitrogen and argon;

placing a semi-crystalline ferroelectric poly(vinylidene fluoride-trifluorethylene) material in said environment;

heating said material to a temperature that is in a range of temperatures above said material's Curie transition but below its melting temperature;

irradiating said material so-heated with beta particles; and monitoring the radiation dose received by said material during said step of irradiating to provide a desired level of fracture toughness within a range of radiation dosage that substantially maintains ferroelectric properties of said material and thereupon terminating further irradiation, wherein said fracture toughness varies as a function of radiation dose.

8. A method according to claim 7 wherein said material is approximately 50–85 weight percent vinylidene fluoride.

9. A method according to claim 7 wherein said material is approximately 65 weight percent vinylidene fluoride, and wherein said temperature achieved during said step of heating is approximately 120° C.

10. A method according to claim 9 wherein said beta particles have an energy level of approximately 2.5 mega electron volts (MeV) and said radiation dose does not exceed approximately 50 megarads (Mrads).

11. A method for increasing fracture toughness and reducing brittleness of annealed ferroelectric poly(vinylidene fluoride-trifluorethylene), comprising the steps of:

providing an environment containing a gas selected from the group consisting of nitrogen and argon;

placing an annealed ferroelectric poly(vinylidene fluoride-trifluorethylene) material in said environment;

heating said material to a temperature that is in a range of temperatures above said material's Curie transition but below its melting temperature;

irradiating said material so-heated with beta particles; and monitoring the radiation dose received by said material during said step of irradiating to provide a desired level of fracture toughness within a range of radiation dosage that substantially maintains ferroelectric properties of said material and thereupon terminating further irradiation, wherein said fracture toughness varies as a function of radiation dose.

12. A method according to claim 11 and wherein:

under the irradiation of the so-heated annealed ferroelectric poly(vinylidene fluoride-trifluorethylene) material with beta particles, the ferroelectric domains of the material remain maintained throughout a range of dosages of radiation having a span beginning with the start of irradiation and ending substantially at a predetermined dosage of radiation whereat any continuation of irradiation thereafter destroys ferroelectric domains;

whereby the portion of said function of variation of fracture toughness with respect to radiation dosage which may be used in achieving a desired level of fracture toughness is constrained to dosages of radiation no greater than said predetermined dosage.

13. A method according to claim 12 wherein said material is approximately 65 weight percent vinylidene fluoride, said beta particles have an energy level of approximately 2.5 mega electron volts (MeV), and said predetermined dosage is approximately 50 megarads.

14. A method according to claim 12 wherein said predetermined dosage of radiation is ascertained empirically.

15. A method according to claim 11 wherein:

said function of variation of fracture toughness with respect to radiation dosage comprising a monotonical increase in toughness beginning with the start of irradiation of the so-heated material and reaching a substantial toughness at a first predetermined dosage of irradiation, but with continued irradiation of the material causing the toughness to decrease; and under the irradiation of the so-heated annealed ferroelectric poly(vinylidene fluoride-trifluorethylene) material with beta particles, the ferroelectric domains of the material are maintained throughout a range of radiation dosages having a span beginning with the start of irradiation and ending substantially at a second predetermined dosage whereat any continued irradiation destroys ferroelectric domains, said second predetermined dosage exceeding said first predetermined dosage and being in a region of dosage of falling value of fracture toughness;

whereby the portion of said function of variation of fracture toughness with respect to radiation dosage which may be used in achieving a desired level of fracture toughness is constrained to dosages of radiation no greater than said second predetermined dosage.

16. A method according to claim 15 wherein said material is approximately 65 weight percent vinylidene fluoride, said beta particles have an energy level of approximately 2.5 mega electron volts (MeV), said first predetermined dosage is approximately 32.5 megarads and said second predetermined dosage is approximately 50 megarads (Mrads).

17. A method according to claim 15 wherein said first and second predetermined dosages of radiation are ascertained empirically.

18. A method according to claim 11 wherein said material is approximately 50–85 weight percent vinylidene fluoride.

19. A method according to claim 11 wherein said material is approximately 65 weight percent vinylidene fluoride, and wherein said temperature achieved during said step of heating is approximately 120° C.

20. A method according to claim 11 wherein said beta particles have an energy level of approximately 2.5 mega electron volts (MeV) and wherein said radiation dosage does not exceed approximately 50 megarads (Mrads).

* * * * *